US012321665B2

(12) United States Patent
Bierbower et al.

(10) Patent No.: US 12,321,665 B2
(45) Date of Patent: Jun. 3, 2025

(54) VOLUME LIMIT

(71) Applicant: Sonos, Inc., Santa Barbara, CA (US)

(72) Inventors: Chris Bierbower, Santa Barbara, CA (US); Nicholas Maniskas, Santa Barbara, CA (US)

(73) Assignee: Sonos, Inc., Goleta, CA (US)

( * ) Notice: Subject to any disclaimer, the term of this patent is extended or adjusted under 35 U.S.C. 154(b) by 0 days.

(21) Appl. No.: 18/501,629

(22) Filed: Nov. 3, 2023

(65) Prior Publication Data

US 2024/0143273 A1    May 2, 2024

Related U.S. Application Data

(63) Continuation of application No. 17/080,640, filed on Oct. 26, 2020, now Pat. No. 11,809,776, which is a (Continued)

(51) Int. Cl.
*G06F 3/16* (2006.01)
*G11B 27/34* (2006.01)
(Continued)

(52) U.S. Cl.
CPC .............. *G06F 3/165* (2013.01); *G11B 27/34* (2013.01); *H03G 3/04* (2013.01); *H03G 3/3026* (2013.01);
(Continued)

(58) Field of Classification Search
CPC ........... G06F 3/165; G11B 27/34; H03G 3/04; H03G 3/3026; H03G 7/002; H03G 7/005;
(Continued)

(56) References Cited

U.S. PATENT DOCUMENTS 5,130,665 A   7/1992  Walden
5,440,644 A   8/1995  Farinelli et al.
(Continued)

FOREIGN PATENT DOCUMENTS

CN    102522961 A    6/2012
CN    103945062 A    7/2014
(Continued)

OTHER PUBLICATIONS

AudioTron Quick Start Guide, Version 1.0, Mar. 2001, 24 pages.
(Continued)

*Primary Examiner* — Yogeshkumar Patel

(57) ABSTRACT

An example first playback device includes programming to perform functions including: (1) storing an active volume state variable in memory, wherein the active volume state variable corresponds to a current playback volume; (2) storing a volume limit state variable in memory, wherein the volume limit state variable corresponds to a playback volume limit of the first playback device; (3) detecting a command to begin playback of media at a proposed playback volume different from the current playback volume; (4) based on comparing (i) the playback volume limit and (ii) the proposed playback volume, selecting a startup playback volume; (5) playing back media at the startup playback volume; and (6) causing at least a second playback.

20 Claims, 7 Drawing Sheets

Related U.S. Application Data continuation of application No. 16/420,541, filed on May 23, 2019, now Pat. No. 10,817,254, which is a continuation of application No. 15/949,021, filed on Apr. 9, 2018, now Pat. No. 10,303,429, which is a continuation of application No. 15/359,722, filed on Nov. 23, 2016, now Pat. No. 9,940,095, which is a continuation of application No. 14/696,366, filed on Apr. 24, 2015, now Pat. No. 9,678,708.

(51) Int. Cl.
*H03G 3/04* (2006.01)
*H03G 3/30* (2006.01)
*H03G 7/00* (2006.01)

(52) U.S. Cl.
CPC ............ *H03G 7/002* (2013.01); *H03G 7/005* (2013.01); *H04R 2227/005* (2013.01)

(58) Field of Classification Search
CPC . H03G 3/20; H03G 3/10; H03G 11/00; H04R 2227/005
See application file for complete search history.

(56) References Cited

U.S. PATENT DOCUMENTS

| | | |
|---|---|---|
| 5,761,320 A | 6/1998 | Farinelli et al. |
| 5,923,902 A | 7/1999 | Inagaki |
| 6,032,202 A | 2/2000 | Lea et al. |
| 6,256,554 B1 | 7/2001 | DiLorenzo |
| 6,404,811 B1 | 6/2002 | Cvetko et al. |
| 6,469,633 B1 | 10/2002 | Wachter |
| 6,522,886 B1 | 2/2003 | Youngs et al. |
| 6,611,537 B1 | 8/2003 | Edens et al. |
| 6,631,410 B1 | 10/2003 | Kowalski et al. |
| 6,757,517 B2 | 6/2004 | Chang |
| 6,778,869 B2 | 8/2004 | Champion |
| 7,130,608 B2 | 10/2006 | Hollstrom et al. |
| 7,130,616 B2 | 10/2006 | Janik |
| 7,143,939 B2 | 12/2006 | Henzerling |
| 7,236,773 B2 | 6/2007 | Thomas |
| 7,295,548 B2 | 11/2007 | Blank et al. |
| 7,391,791 B2 | 6/2008 | Balassanian et al. |
| 7,483,538 B2 | 1/2009 | McCarty et al. |
| 7,571,014 B1 | 8/2009 | Lambourne et al. |
| 7,630,501 B2 | 12/2009 | Blank et al. |
| 7,643,894 B2 | 1/2010 | Braithwaite et al. |
| 7,657,910 B1 | 2/2010 | McAulay et al. |
| 7,840,740 B2 | 11/2010 | Minoo |
| 7,853,341 B2 | 12/2010 | McCarty et al. |
| 7,987,294 B2 | 7/2011 | Bryce et al. |
| 8,014,423 B2 | 9/2011 | Thaler et al. |
| 8,045,952 B2 | 10/2011 | Qureshey et al. |
| 8,103,009 B2 | 1/2012 | McCarty et al. |
| 8,234,395 B2 | 7/2012 | Millington |
| 8,483,853 B1 | 7/2013 | Lambourne |
| 8,942,252 B2 | 1/2015 | Balassanian et al. |
| 8,983,383 B1 | 3/2015 | Haskin |
| 9,438,193 B2 | 9/2016 | Dizon et al. |
| 9,654,073 B2 | 5/2017 | Apodaca |
| 9,678,708 B2 | 6/2017 | Bierbower et al. |
| 9,916,126 B2 | 3/2018 | Lang |
| 9,940,095 B2 | 4/2018 | Bierbower et al. |
| 10,303,429 B2 | 5/2019 | Bierbower et al. |
| 2001/0042107 A1 | 11/2001 | Palm |
| 2002/0022453 A1 | 2/2002 | Balog et al. |
| 2002/0026442 A1 | 2/2002 | Lipscomb et al. |
| 2002/0124097 A1 | 9/2002 | Isely et al. |
| 2003/0157951 A1 | 8/2003 | Hasty, Jr. |
| 2004/0024478 A1 | 2/2004 | Hans et al. |
| 2007/0142944 A1 | 6/2007 | Goldberg et al. |
| 2011/0159469 A1 | 6/2011 | Hwang et al. |
| 2012/0051560 A1 | 3/2012 | Sanders |
| 2013/0148825 A1 | 6/2013 | Fukuma |
| 2013/0202132 A1 | 8/2013 | Zurek et al. |
| 2013/0273869 A1 | 10/2013 | Parker et al. |
| 2013/0317635 A1* | 11/2013 | Bates .................... G06F 3/0482 700/94 |
| 2013/0343566 A1* | 12/2013 | Triplett ................ H04N 21/242 381/77 |
| 2014/0037107 A1* | 2/2014 | Marino, Jr. .......... H03G 3/3005 381/107 |
| 2014/0046464 A1 | 2/2014 | Reimann |
| 2014/0363022 A1 | 12/2014 | Dizon et al. |
| 2014/0363024 A1 | 12/2014 | Apodaca |
| 2014/0380234 A1 | 12/2014 | Shim et al. |
| 2015/0032812 A1* | 1/2015 | Dudley .............. H04N 21/4431 709/204 |
| 2015/0095689 A1 | 4/2015 | Millington et al. |
| 2015/0215382 A1 | 7/2015 | Arora et al. |

FOREIGN PATENT DOCUMENTS

| | | |
|---|---|---|
| CN | 103997563 A | 8/2014 |
| EP | 1389853 A1 | 2/2004 |
| JP | 2007033921 A | 2/2007 |
| JP | 2010288183 A | 12/2010 |
| WO | 200153994 | 7/2001 |
| WO | 2003093950 A2 | 11/2003 |
| WO | 2011040009 A1 | 4/2011 |
| WO | 2013189434 A2 | 12/2013 |
| WO | 2014004964 A1 | 1/2014 |

OTHER PUBLICATIONS

AudioTron Reference Manual, Version 3.0, May 2002, 70 pages.
AudioTron Setup Guide, Version 3.0, May 2002, 38 pages.
Bluetooth. "Specification of the Bluetooth System: The ad hoc Scatternet for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Chinese Patent Office, First Office Action and Translation mailed on Sep. 29, 2019, issued in connection with Chinese Application No. 201680030030.4, 15 pages.
Corrected Notice of Allowability mailed on Dec. 12, 2016, issued in connection with U.S. Appl. No. 14/696,366, filed Apr. 24, 2015, 6 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
Final Office Action mailed on Mar. 23, 2020, issued in connection with U.S. Appl. No. 16/420,541, filed May 23, 2019, 18 pages.
First Action Interview Office Action mailed on Jul. 26, 2016, issued in connection with U.S. Appl. No. 14/696,366, filed Apr. 24, 2015, 7 pages.
International Bureau, International Preliminary Report on Patentability and Written Opinion, mailed on Oct. 24, 2017, issued in connection with International Application No. PCT/US2016/028462, filed on Apr. 20, 2016, 7 pages.
International Search Authority, International Search Report and Written Opinion mailed on Jul. 29, 2016, issued in connection with International Application No. PCT/US2016/028462, filed on Apr. 20, 2016, 13 pages.
Japanese Patent Office, Final Office Action and Translation mailed on Jul. 23, 2019, issued in connection with Japanese Patent Application No. 2017-555679, 7 pages.
Japanese Patent Office, Office Action and Translation mailed on Dec. 18, 2018, issued in connection with Japanese Application No. 2017-555679, 8 pages.
Japanese Patent Office, Translation of Final Office Action mailed on Jul. 25, 2019, issued in connection with Japanese Patent Application No. 2017-555679, 4 pages.
Jo et al., "Synchronized One-to-many Media Streaming with Adaptive Playout Control," Proceedings of SPIE, 2002, pp. 71-82, vol. 4861.

(56) References Cited

OTHER PUBLICATIONS

Jones, Stephen, "Dell Digital Audio Receiver: Digital upgrade for your analog stereo," Analog Stereo, Jun. 24, 2000 http://www.reviewsonline.com/articles/961906864.htm retrieved Jun. 18, 2014, 2 pages.
Louderback, Jim, "Affordable Audio Receiver Furnishes Homes With MP3," TechTV Vault. Jun. 28, 2000 retrieved Jul. 10, 2014, 2 pages.
Non-Final Office Action mailed on Oct. 3, 2019, issued in connection with U.S. Appl. No. 16/420,541, filed May 23, 2019, 16 pages.
Non-Final Office Action mailed on Aug. 8, 2017, issued in connection with U.S. Appl. No. 15/359,722, filed Nov. 23, 2016, 13 pages.
Non-Final Office Action mailed on Aug. 1, 2018, issued in connection with U.S. Appl. No. 15/949,021, filed Apr. 9, 2018, 15 pages.
Notice of Allowance mailed on Dec. 13, 2017, issued in connection with U.S. Appl. No. 15/359,722, filed Nov. 23, 2016, 5 pages.
Notice of Allowance mailed on Nov. 16, 2016, issued in connection with U.S. Appl. No. 14/696,366, filed Apr. 24, 2015, 5 pages.
Notice of Allowance mailed on Mar. 17, 2017, issued in connection with U.S. Appl. No. 14/696,366, filed Apr. 24, 2015, 10 pages.
Notice of Allowance mailed on Feb. 21, 2019, issued in connection with U.S. Appl. No. 15/949,021, filed Apr. 9, 2018, 6 pages.
Notice of Allowance mailed on Jun. 23, 2020, issued in connection with U.S. Appl. No. 16/420,541, filed May 23, 2019, 6 pages.
Notice of Allowance mailed on Jul. 27, 2023, issued in connection with U.S. Appl. No. 17/080,640, filed Oct. 26, 2020, 9 pages.
Palm, Inc., "Handbook for the Palm VII Handheld," May 2000, 311 pages.
Preinterview First Office Action mailed on May 18, 2016, issued in connection with U.S. Appl. No. 14/696,366, filed Apr. 24, 2015, 5 pages.
Presentations at WinHEC 2000, May 2000, 138 pages.
U.S. Appl. No. 60/490,768, filed Jul. 28, 2003, entitled "Method for synchronizing audio playback between multiple networked devices," 13 pages.
U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.

* cited by examiner

| State | | Status LED Sequence | | | | | | | | Repeat | Notes |
|---|---|---|---|---|---|---|---|---|---|---|---|
| | | 1 | 2 | 3 | 4 | 5 | 6 | 7 | 8 | | |
| Power | Powered On (normal mode) | W | | | | | | | | Repeat | |
| | Powering Up | A | W | W | W | W | W | W | W | Repeat | Slow-Quick Breathe Fade during unboot |
| | Powering in Factory Reset | A | A | A | A | A | A | A | W | Repeat | Started by pressing the Join Button while applying power |
| | Powered not connected to House ID | G | G | G | G | G | G | G | | Repeat | Sonos Join Fade |
| | WAC Join Ready | G | G | G | G | G | G | G | | Repeat | Quick Breathe Fade |
| | Power Down | W | W | | | | | | | No Repeat | Instant on, hold for .5 seconds, fade out over .75 seconds. |
| Household | Looking for House ID (Sonos Net) | A | A | A | A | A | A | | | Repeat | Quick Breathe Fade |
| Play/Pause | Preparing for playback/pause | W | | W | | W | | W | | Repeat | Quick Breathe Fade. Fade at least once, and continue until playback starts/pauses (as appropriate) |
| Cap Sense | | | | | | | | | | | |
| Contact | Finger touching any capacitive area | W | W | W | W | W | W | W | W | Repeat | Light remains white for duration of contact. |
| IR Feedback | IR signal received from IR remote | W | W | W | W | W | W | W | W | Repeat | Light remains white for duration of recognized IR signal(s) |

FIGURE 8

VOLUME LIMIT

CROSS REFERENCE TO RELATED APPLICATIONS

The present application is a continuation of U.S. application Ser. No. 17/080,640 filed on Oct. 26, 2020, which is a continuation of U.S. application Ser. No. 16/420,541 filed on May 23, 2019, which is a continuation of U.S. application Ser. No. 15/949,021 filed on Apr. 9, 2018, which is a continuation of U.S. application Ser. No. 15/359,722 filed on Nov. 23, 2016, which is a continuation of U.S. application Ser. No. 14/696,366 filed Apr. 24, 2015, all of which are explicitly incorporated by reference herein in their entirety.

U.S. application Ser. No. 14/500,465, entitled "Playback Device Control", filed on Sep. 29, 2014 is hereby incorporated by reference in its entirety.

FIELD OF THE DISCLOSURE

The disclosure is related to consumer goods and, more particularly, to methods, systems, products, features, services, and other elements directed to media playback or some aspect thereof.

BACKGROUND

Options for accessing and listening to digital audio in an out-loud setting were limited until in 2003, when SONOS, Inc. filed for one of its first patent applications, entitled "Method for Synchronizing Audio Playback between Multiple Networked Devices," and began offering a media playback system for sale in 2005. The Sonos Wireless HiFi System enables people to experience music from many sources via one or more networked playback devices. Through a software control application installed on a smartphone, tablet, or computer, one can play what he or she wants in any room that has a networked playback device. Additionally, using the controller, for example, different songs can be streamed to each room with a playback device, rooms can be grouped together for synchronous playback, or the same song can be heard in all rooms synchronously.

Given the ever growing interest in digital media, there continues to be a need to develop consumer-accessible technologies to further enhance the listening experience.

BRIEF DESCRIPTION OF THE DRAWINGS

Features, aspects, and advantages of the presently disclosed technology may be better understood with regard to the following description, appended claims, and accompanying drawings where:

FIG. 8 shows an example schedule of LED sequences.

Figure 1:
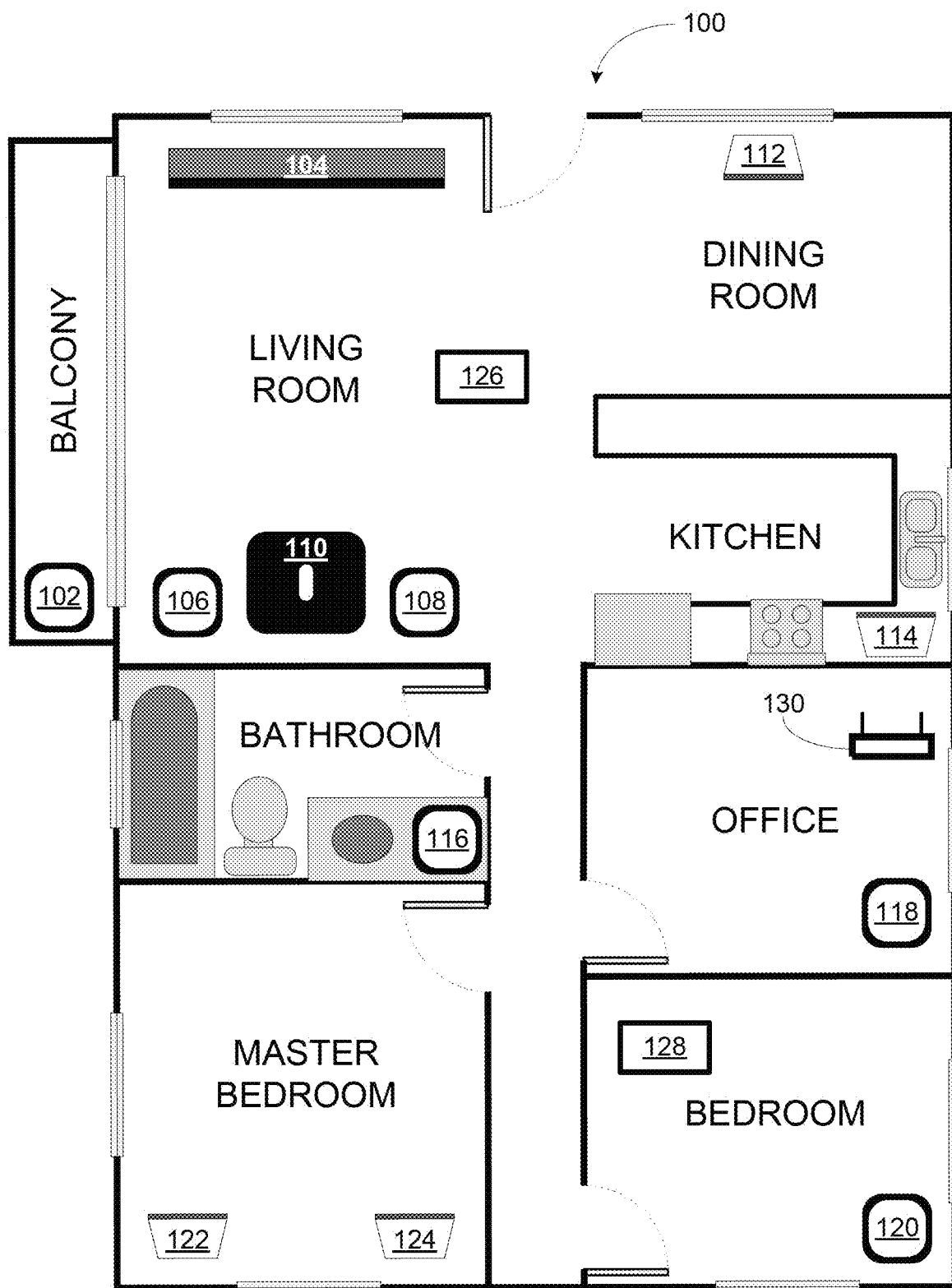
FIG. 1 shows an example media playback system configuration in which certain embodiments may be practiced.

The drawings are for the purpose of illustrating example embodiments, but it is understood that the inventions are not limited to the arrangements and instrumentality shown in the drawings.

DETAILED DESCRIPTION

I. Overview

Examples described herein involve limiting the playback volume of a playback device based on the source of a command to control the playback device. There are many instances where it may be desirable to limit the volume of a playback device. One such example may be when a command to control playback of the playback device is detected from a given source, where the given source might not provide the user with an indication of the current volume of the playback device.

In some embodiments, a playback device may store an active volume state variable in memory, corresponding to the current playback volume of the playback device. In this case, the "current" playback volume of the playback device does not necessarily mean that the playback device is playing back media. Rather, it refers to the current volume configuration of the playback device whether it is playing back media or not. The playback device might also store a volume limit state variable that corresponds to a playback volume limit. This volume limit state variable may be utilized in certain situations. For instance, the playback device itself may include a touch sensor for beginning playback of media from the playback device. However, it may not include an indication of the current volume. Thus, situations may occur where a user begins playback via the playback device controls and is startled by the current volume of the media, which may be louder than expected. For instance, the playback device may be paused for an extended period of time, and a user may forget how loud the current playback volume is. The volume might also be accidentally increased by the user or someone else, or perhaps even a pet, while the playback device is paused.

Therefore, the playback device may detect the source of the command to begin playback, and based on the source of the command, determine whether the playback limit state variable should be used. For instance, if the current volume is too high, it may instead begin playback based on the playback limit state variable.

A similar situation may occur when a command to increase the volume of a playback device is received while the playback device is in a paused state. As above, the command to increase the volume may be received at a device that does not indicate the current volume to the user. In these situations, the playback device may detect the source of the command to increase the volume to a proposed playback volume, and then compare the proposed playback volume to a volume limit state variable. If the proposed volume increase is too high, for instance, the current volume will be set to the volume limit state variable. Other examples are also possible, and may involve minimum volume limits and specific volume levels as well.

A playback device may also include LED lighting on one or more surfaces that may provide feedback on the status of the playback device. The LED lighting may include several different colors of LED lights, such as red, blue, green, and white, which may be mixed to create a broad spectrum of colors. The playback device may also be capable of fading the LED lighting between different colors smoothly and without noticeable flickering.

In some cases, a first playback device with a given set of LED lighting behaviors may be connected to a second playback device that has a different set of LED lighting behaviors, or perhaps generic LED lighting behaviors that are not specified for different states of the playback device. In this case, the second playback device may inherit the LED lighting behaviors of the first playback device.

As indicated above, the examples involve limiting the playback volume of a playback device based on a source of the playback command. In one aspect, a playback device is provided. The playback device includes (a) a processor, (b) a non-transitory computer-readable medium, and (c) program instructions stored on the non-transitory computer-readable medium that, when executed by the processor, cause the playback device to perform functions including (i) storing an active volume state variable in memory, where the active volume state variable corresponds to a current playback volume, (ii) storing a volume limit state variable in memory, where the volume limit state variable corresponds to a playback volume limit of the playback device, (iii) detecting, by the playback device, a command to begin playback of media from a given source, (iv) selecting a startup playback volume to be one of the current playback volume and the playback volume limit based on the given source of the command to begin playback, and (v) playing back media at the startup playback volume.

In another aspect, a playback device is provided. The playback device includes (a) a processor, (b) a non-transitory computer-readable medium, and (c) program instructions stored on the non-transitory computer-readable medium that, when executed by the processor, cause the playback device to perform functions including (i) storing, by the playback device, a maximum volume state variable corresponding to a maximum playback volume of the playback device, (ii) detecting, while the playback device is in a paused state for play back of media, a command received from a given source to increase the playback volume of the playback device to a proposed playback volume, (iii) determining an active volume state variable based on (1) the given source and (2) a comparison of the proposed playback volume to the maximum volume state variable, where the active volume state variable corresponds to a current playback volume, and (iv) storing the active volume state variable in memory.

In yet another aspect, a method is provided. The method involves (a) storing, by a playback device, an active volume state variable in memory, where the active volume state variable corresponds to a current playback volume, (b) storing a volume limit state variable in memory, where the volume limit state variable corresponds to a playback volume limit of the playback device, (c) detecting, by the playback device, a command to begin playback of media from a given source, (d) selecting a startup playback volume to be one of the current playback volume and the playback volume limit based on the given source of the command to begin playback, and (e) playing back media at the startup playback volume.

It will be understood by one of ordinary skill in the art that this disclosure includes numerous other embodiments. It will be understood by one of ordinary skill in the art that this disclosure includes numerous other examples. While some examples described herein may refer to functions performed by given actors such as "users" and/or other entities, it should be understood that this description is for purposes of explanation only. The claims should not be interpreted to require action by any such example actor unless explicitly required by the language of the claims themselves.

While some examples described herein may refer to functions performed by given actors such as "users" and/or other entities, it should be understood that this is for purposes of explanation only. The claims should not be interpreted to require action by any such example actor unless explicitly required by the language of the claims themselves.

II. Example Operating Environment

FIG. 1 shows an example configuration of a media playback system 100 in which one or more embodiments disclosed herein may be practiced or implemented. The media playback system 100 as shown is associated with an example home environment having several rooms and spaces, such as for example, a master bedroom, an office, a dining room, and a living room. As shown in the example of FIG. 1, the media playback system 100 includes playback devices 102-124, control devices 126 and 128, and a wired or wireless network router 130.

Further discussions relating to the different components of the example media playback system 100 and how the different components may interact to provide a user with a media experience may be found in the following sections. While discussions herein may generally refer to the example media playback system 100, technologies described herein are not limited to applications within, among other things, the home environment as shown in FIG. 1. For instance, the technologies described herein may be useful in environments where multi-zone audio may be desired, such as, for example, a commercial setting like a restaurant, mall or airport, a vehicle like a sports utility vehicle (SUV), bus or car, a ship or boat, an airplane, and so on.

a. Example Playback Devices

Figure 2:
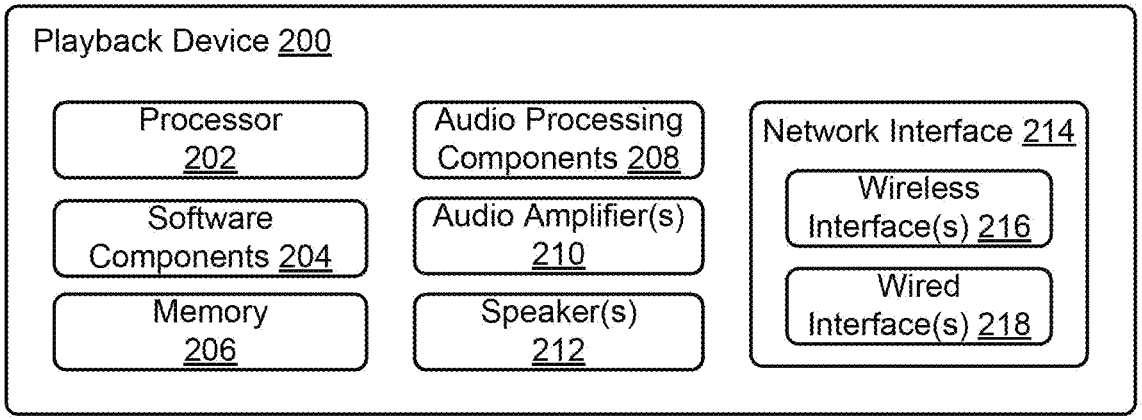
FIG. 2 shows a functional block diagram of an example playback device.

FIG. 2 shows a functional block diagram of an example playback device 200 that may be configured to be one or more of the playback devices 102-124 of the media playback system 100 of FIG. 1. The playback device 200 may include a processor 202, software components 204, memory 206, audio processing components 208, audio amplifier(s) 210, speaker(s) 212, and a network interface 214 including wireless interface(s) 216 and wired interface(s) 218. In one case, the playback device 200 may not include the speaker(s) 212, but rather a speaker interface for connecting the playback device 200 to external speakers. In another case, the playback device 200 may include neither the speaker(s) 212 nor the audio amplifier(s) 210, but rather an audio interface for connecting the playback device 200 to an external audio amplifier or audio-visual receiver.

In one example, the processor 202 may be a clock-driven computing component configured to process input data according to instructions stored in the memory 206. The memory 206 may be a tangible computer-readable medium configured to store instructions executable by the processor 202. For instance, the memory 206 may be data storage that can be loaded with one or more of the software components 204 executable by the processor 202 to achieve certain functions. In one example, the functions may involve the playback device 200 retrieving audio data from an audio source or another playback device. In another example, the functions may involve the playback device 200 sending audio data to another device or playback device on a network. In yet another example, the functions may involve pairing of the playback device 200 with one or more playback devices to create a multi-channel audio environment.

Certain functions may involve the playback device 200 synchronizing playback of audio content with one or more other playback devices. During synchronous playback, a listener will preferably not be able to perceive time-delay differences between playback of the audio content by the playback device 200 and the one or more other playback devices. U.S. Pat. No. 8,234,395 entitled, "System and method for synchronizing operations among a plurality of independently clocked digital data processing devices," which is hereby incorporated by reference, provides in more detail some examples for audio playback synchronization among playback devices.

The memory 206 may further be configured to store data associated with the playback device 200, such as one or more zones and/or zone groups the playback device 200 is a part of, audio sources accessible by the playback device 200, or a playback queue that the playback device 200 (or some other playback device) may be associated with. The data may be stored as one or more state variables that are periodically updated and used to describe the state of the playback device 200. The memory 206 may also include the data associated with the state of the other devices of the media system, and shared from time to time among the devices so that one or more of the devices have the most recent data associated with the system. Other embodiments are also possible.

The audio processing components 208 may include one or more digital-to-analog converters (DAC), an audio preprocessing component, an audio enhancement component or a digital signal processor (DSP), and so on. In one embodiment, one or more of the audio processing components 208 may be a subcomponent of the processor 202. In one example, audio content may be processed and/or intentionally altered by the audio processing components 208 to produce audio signals. The produced audio signals may then be provided to the audio amplifier(s) 210 for amplification and playback through speaker(s) 212. Particularly, the audio amplifier(s) 210 may include devices configured to amplify audio signals to a level for driving one or more of the speakers 212. The speaker(s) 212 may include an individual transducer (e.g., a "driver") or a complete speaker system involving an enclosure with one or more drivers. A particular driver of the speaker(s) 212 may include, for example, a subwoofer (e.g., for low frequencies), a mid-range driver (e.g., for middle frequencies), and/or a tweeter (e.g., for high frequencies). In some cases, each transducer in the one or more speakers 212 may be driven by an individual corresponding audio amplifier of the audio amplifier(s) 210. In addition to producing analog signals for playback by the playback device 200, the audio processing components 208 may be configured to process audio content to be sent to one or more other playback devices for playback.

Audio content to be processed and/or played back by the playback device 200 may be received from an external source, such as via an audio line-in input connection (e.g., an auto-detecting 3.5 mm audio line-in connection) or the network interface 214.

The network interface 214 may be configured to facilitate a data flow between the playback device 200 and one or more other devices on a data network. As such, the playback device 200 may be configured to receive audio content over the data network from one or more other playback devices in communication with the playback device 200, network devices within a local area network, or audio content sources over a wide area network such as the Internet. In one example, the audio content and other signals transmitted and received by the playback device 200 may be transmitted in the form of digital packet data containing an Internet Protocol (IP)-based source address and IP-based destination addresses. In such a case, the network interface 214 may be configured to parse the digital packet data such that the data destined for the playback device 200 is properly received and processed by the playback device 200.

As shown, the network interface 214 may include wireless interface(s) 216 and wired interface(s) 218. The wireless interface(s) 216 may provide network interface functions for the playback device 200 to wirelessly communicate with other devices (e.g., other playback device(s), speaker(s), receiver(s), network device(s), control device(s) within a data network the playback device 200 is associated with) in accordance with a communication protocol (e.g., any wireless standard including IEEE 802.11a, 802.11b, 802.11g, 802.11n, 802.11ac, 802.15, 4G mobile communication standard, and so on). The wired interface(s) 218 may provide network interface functions for the playback device 200 to communicate over a wired connection with other devices in accordance with a communication protocol (e.g., IEEE 802.3). While the network interface 214 shown in FIG. 2 includes both wireless interface(s) 216 and wired interface (s) 218, the network interface 214 may in some embodiments include only wireless interface(s) or only wired interface(s).

In one example, the playback device 200 and one other playback device may be paired to play two separate audio components of audio content. For instance, playback device 200 may be configured to play a left channel audio component, while the other playback device may be configured to play a right channel audio component, thereby producing or enhancing a stereo effect of the audio content. The paired playback devices (also referred to as "bonded playback devices") may further play audio content in synchrony with other playback devices.

In another example, the playback device 200 may be sonically consolidated with one or more other playback devices to form a single, consolidated playback device. A consolidated playback device may be configured to process and reproduce sound differently than an unconsolidated playback device or playback devices that are paired, because a consolidated playback device may have additional speaker drivers through which audio content may be rendered. For instance, if the playback device 200 is a playback device designed to render low frequency range audio content (i.e. a subwoofer), the playback device 200 may be consolidated with a playback device designed to render full frequency range audio content. In such a case, the full frequency range playback device, when consolidated with the low frequency playback device 200, may be configured to render only the mid and high frequency components of audio content, while the low frequency range playback device 200 renders the low frequency component of the audio content. The consolidated playback device may further be paired with a single playback device or yet another consolidated playback device.

By way of illustration, SONOS, Inc. presently offers (or has offered) for sale certain playback devices including a "PLAY:1," "PLAY:3," "PLAY:5," "PLAYBAR," "CONNECT:AMP," "CONNECT," and "SUB." Any other past, present, and/or future playback devices may additionally or alternatively be used to implement the playback devices of example embodiments disclosed herein. Additionally, it is understood that a playback device is not limited to the example illustrated in FIG. 2 or to the SONOS product offerings. For example, a playback device may include a wired or wireless headphone. In another example, a playback device may include or interact with a docking station for personal mobile media playback devices. In yet another example, a playback device may be integral to another device or component such as a television, a lighting fixture, or some other device for indoor or outdoor use.

b. Example Playback Zone Configurations

Referring back to the media playback system 100 of FIG. 1, the environment may have one or more playback zones, each with one or more playback devices. The media playback system 100 may be established with one or more playback zones, after which one or more zones may be added, or removed to arrive at the example configuration shown in FIG. 1. Each zone may be given a name according to a different room or space such as an office, bathroom, master bedroom, bedroom, kitchen, dining room, living room, and/or balcony. In one case, a single playback zone may include multiple rooms or spaces. In another case, a single room or space may include multiple playback zones.

As shown in FIG. 1, the balcony, dining room, kitchen, bathroom, office, and bedroom zones each have one playback device, while the living room and master bedroom zones each have multiple playback devices. In the living room zone, playback devices 104, 106, 108, and 110 may be configured to play audio content in synchrony as individual playback devices, as one or more bonded playback devices, as one or more consolidated playback devices, or any combination thereof. Similarly, in the case of the master bedroom, playback devices 122 and 124 may be configured to play audio content in synchrony as individual playback devices, as a bonded playback device, or as a consolidated playback device.

In one example, one or more playback zones in the environment of FIG. 1 may each be playing different audio content. For instance, the user may be grilling in the balcony zone and listening to hip hop music being played by the playback device 102 while another user may be preparing food in the kitchen zone and listening to classical music being played by the playback device 114. In another example, a playback zone may play the same audio content in synchrony with another playback zone. For instance, the user may be in the office zone where the playback device 118 is playing the same rock music that is being playing by playback device 102 in the balcony zone. In such a case, playback devices 102 and 118 may be playing the rock music in synchrony such that the user may seamlessly (or at least substantially seamlessly) enjoy the audio content that is being played out-loud while moving between different playback zones. Synchronization among playback zones may be achieved in a manner similar to that of synchronization among playback devices, as described in previously referenced U.S. Pat. No. 8,234,395.

As suggested above, the zone configurations of the media playback system 100 may be dynamically modified, and in some embodiments, the media playback system 100 supports numerous configurations. For instance, if a user physically moves one or more playback devices to or from a zone, the media playback system 100 may be reconfigured to accommodate the change(s). For instance, if the user physically moves the playback device 102 from the balcony zone to the office zone, the office zone may now include both the playback device 118 and the playback device 102. The playback device 102 may be paired or grouped with the office zone and/or renamed if so desired via a control device such as the control devices 126 and 128. On the other hand, if the one or more playback devices are moved to a particular area in the home environment that is not already a playback zone, a new playback zone may be created for the particular area.

Further, different playback zones of the media playback system 100 may be dynamically combined into zone groups or split up into individual playback zones. For instance, the dining room zone and the kitchen zone 114 may be combined into a zone group for a dinner party such that playback devices 112 and 114 may render audio content in synchrony. On the other hand, the living room zone may be split into a television zone including playback device 104, and a listening zone including playback devices 106, 108, and 110, if the user wishes to listen to music in the living room space while another user wishes to watch television.

c. Example Control Devices

Figure 3:
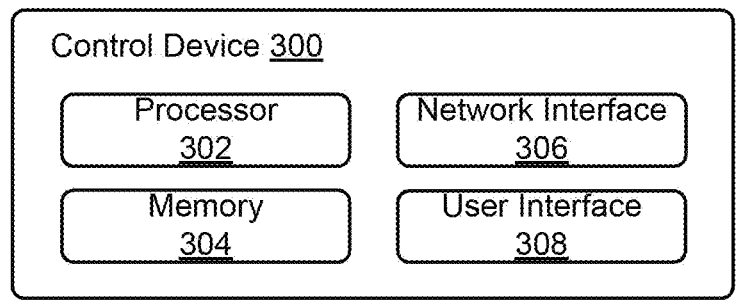
FIG. 3 shows a functional block diagram of an example control device.

FIG. 3 shows a functional block diagram of an example control device 300 that may be configured to be one or both of the control devices 126 and 128 of the media playback system 100. As shown, the control device 300 may include a processor 302, memory 304, a network interface 306, and a user interface 308. In one example, the control device 300 may be a dedicated controller for the media playback system 100. In another example, the control device 300 may be a network device on which media playback system controller application software may be installed, such as for example, an iPhone™, iPad™ or any other smart phone, tablet or network device (e.g., a networked computer such as a PC or Mac™).

The processor 302 may be configured to perform functions relevant to facilitating user access, control, and configuration of the media playback system 100. The memory 304 may be configured to store instructions executable by the processor 302 to perform those functions. The memory 304 may also be configured to store the media playback system controller application software and other data associated with the media playback system 100 and the user.

In one example, the network interface 306 may be based on an industry standard (e.g., infrared, radio, wired standards including IEEE 802.3, wireless standards including IEEE 802.11a, 802.11b, 802.11g, 802.11n, 802.11ac, 802.15, 4G mobile communication standard, and so on). The network interface 306 may provide a means for the control device 300 to communicate with other devices in the media playback system 100. In one example, data and information (e.g., such as a state variable) may be communicated between control device 300 and other devices via the network interface 306. For instance, playback zone and zone group configurations in the media playback system 100 may be received by the control device 300 from a playback device or another network device, or transmitted by the control device 300 to another playback device or network device via the network interface 306. In some cases, the other network device may be another control device.

Playback device control commands such as volume control and audio playback control may also be communicated from the control device 300 to a playback device via the network interface 306. As suggested above, changes to configurations of the media playback system 100 may also be performed by a user using the control device 300. The configuration changes may include adding/removing one or more playback devices to/from a zone, adding/removing one or more zones to/from a zone group, forming a bonded or consolidated player, separating one or more playback devices from a bonded or consolidated player, among others. Accordingly, the control device 300 may sometimes be referred to as a controller, whether the control device 300 is a dedicated controller or a network device on which media playback system controller application software is installed.

Figure 4:
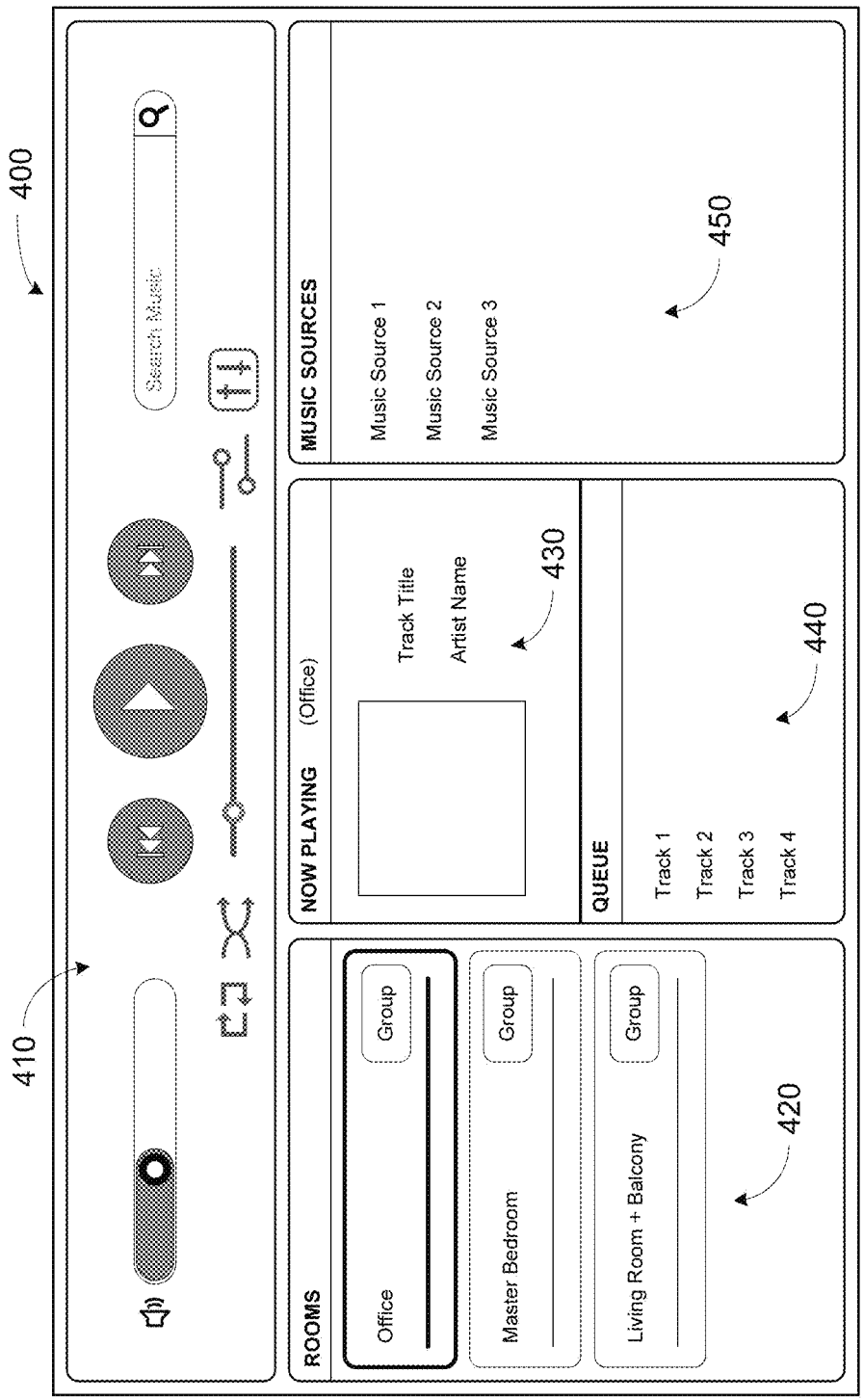
FIG. 4 shows an example controller interface.

The user interface 308 of the control device 300 may be configured to facilitate user access and control of the media playback system 100, by providing a controller interface such as the controller interface 400 shown in FIG. 4. The controller interface 400 includes a playback control region 410, a playback zone region 420, a playback status region 430, a playback queue region 440, and an audio content sources region 450. The user interface 400 as shown is just one example of a user interface that may be provided on a network device such as the control device 300 of FIG. 3 (and/or the control devices 126 and 128 of FIG. 1) and accessed by users to control a media playback system such as the media playback system 100. Other user interfaces of varying formats, styles, and interactive sequences may alternatively be implemented on one or more network devices to provide comparable control access to a media playback system.

The playback control region 410 may include selectable (e.g., by way of touch or by using a cursor) icons to cause playback devices in a selected playback zone or zone group to play or pause, fast forward, rewind, skip to next, skip to previous, enter/exit shuffle mode, enter/exit repeat mode, enter/exit cross fade mode. The playback control region 410 may also include selectable icons to modify equalization settings, and playback volume, among other possibilities.

The playback zone region 420 may include representations of playback zones within the media playback system 100. In some embodiments, the graphical representations of playback zones may be selectable to bring up additional selectable icons to manage or configure the playback zones in the media playback system, such as a creation of bonded zones, creation of zone groups, separation of zone groups, and renaming of zone groups, among other possibilities.

For example, as shown, a "group" icon may be provided within each of the graphical representations of playback zones. The "group" icon provided within a graphical representation of a particular zone may be selectable to bring up options to select one or more other zones in the media playback system to be grouped with the particular zone. Once grouped, playback devices in the zones that have been grouped with the particular zone will be configured to play audio content in synchrony with the playback device(s) in the particular zone. Analogously, a "group" icon may be provided within a graphical representation of a zone group. In this case, the "group" icon may be selectable to bring up options to deselect one or more zones in the zone group to be removed from the zone group. Other interactions and implementations for grouping and ungrouping zones via a user interface such as the user interface 400 are also possible. The representations of playback zones in the playback zone region 420 may be dynamically updated as playback zone or zone group configurations are modified.

The playback status region 430 may include graphical representations of audio content that is presently being played, previously played, or scheduled to play next in the selected playback zone or zone group. The selected playback zone or zone group may be visually distinguished on the user interface, such as within the playback zone region 420 and/or the playback status region 430. The graphical representations may include track title, artist name, album name, album year, track length, and other relevant information that may be useful for the user to know when controlling the media playback system via the user interface 400.

The playback queue region 440 may include graphical representations of audio content in a playback queue associated with the selected playback zone or zone group. In some embodiments, each playback zone or zone group may be associated with a playback queue containing information corresponding to zero or more audio items for playback by the playback zone or zone group. For instance, each audio item in the playback queue may comprise a uniform resource identifier (URI), a uniform resource locator (URL) or some other identifier that may be used by a playback device in the playback zone or zone group to find and/or retrieve the audio item from a local audio content source or a networked audio content source, possibly for playback by the playback device.

In one example, a playlist may be added to a playback queue, in which case information corresponding to each audio item in the playlist may be added to the playback queue. In another example, audio items in a playback queue may be saved as a playlist. In a further example, a playback queue may be empty, or populated but "not in use" when the playback zone or zone group is playing continuously streaming audio content, such as Internet radio that may continue to play until otherwise stopped, rather than discrete audio items that have playback durations. In an alternative embodiment, a playback queue can include Internet radio and/or other streaming audio content items and be "in use" when the playback zone or zone group is playing those items. Other examples are also possible.

When playback zones or zone groups are "grouped" or "ungrouped," playback queues associated with the affected playback zones or zone groups may be cleared or re-associated. For example, if a first playback zone including a first playback queue is grouped with a second playback zone including a second playback queue, the established zone group may have an associated playback queue that is initially empty, that contains audio items from the first playback queue (such as if the second playback zone was added to the first playback zone), that contains audio items from the second playback queue (such as if the first playback zone was added to the second playback zone), or a combination of audio items from both the first and second playback queues. Subsequently, if the established zone group is ungrouped, the resulting first playback zone may be re-associated with the previous first playback queue, or be associated with a new playback queue that is empty or contains audio items from the playback queue associated with the established zone group before the established zone group was ungrouped. Similarly, the resulting second playback zone may be re-associated with the previous second playback queue, or be associated with a new playback queue that is empty, or contains audio items from the playback queue associated with the established zone group before the established zone group was ungrouped. Other examples are also possible.

Referring back to the user interface 400 of FIG. 4, the graphical representations of audio content in the playback queue region 440 may include track titles, artist names, track lengths, and other relevant information associated with the audio content in the playback queue. In one example, graphical representations of audio content may be selectable to bring up additional selectable icons to manage and/or manipulate the playback queue and/or audio content represented in the playback queue. For instance, a represented audio content may be removed from the playback queue, moved to a different position within the playback queue, or selected to be played immediately, or after any currently playing audio content, among other possibilities. A playback queue associated with a playback zone or zone group may be stored in a memory on one or more playback devices in the playback zone or zone group, on a playback device that is not in the playback zone or zone group, and/or some other designated device.

The audio content sources region 450 may include graphical representations of selectable audio content sources from which audio content may be retrieved and played by the selected playback zone or zone group. Discussions pertaining to audio content sources may be found in the following section.

d. Example Audio Content Sources

As indicated previously, one or more playback devices in a zone or zone group may be configured to retrieve for playback audio content (e.g. according to a corresponding URI or URL for the audio content) from a variety of available audio content sources. In one example, audio content may be retrieved by a playback device directly from a corresponding audio content source (e.g., a line-in connection). In another example, audio content may be provided to a playback device over a network via one or more other playback devices or network devices.

Example audio content sources may include a memory of one or more playback devices in a media playback system such as the media playback system 100 of FIG. 1, local music libraries on one or more network devices (such as a control device, a network-enabled personal computer, or a networked-attached storage (NAS), for example), streaming audio services providing audio content via the Internet (e.g., the cloud), or audio sources connected to the media playback system via a line-in input connection on a playback device or network devise, among other possibilities.

In some embodiments, audio content sources may be regularly added or removed from a media playback system such as the media playback system 100 of FIG. 1. In one example, an indexing of audio items may be performed whenever one or more audio content sources are added, removed or updated. Indexing of audio items may involve scanning for identifiable audio items in all folders/directory shared over a network accessible by playback devices in the media playback system, and generating or updating an audio content database containing metadata (e.g., title, artist, album, track length, among others) and other associated information, such as a URI or URL for each identifiable audio item found. Other examples for managing and maintaining audio content sources may also be possible.

The above discussions relating to playback devices, controller devices, playback zone configurations, and media content sources provide only some examples of operating environments within which functions and methods described below may be implemented. Other operating environments and configurations of media playback systems, playback devices, and network devices not explicitly described herein may also be applicable and suitable for implementation of the functions and methods.

III. Example Techniques to Limit Playback Volume

As discussed above, embodiments described herein may involve limiting the playback volume of a playback device based on the source of a command to control the playback device. For example, the command to control the playback device may be a command to begin playback of media, or a command to control the playback volume. Other examples are also possible.

Figure 6:
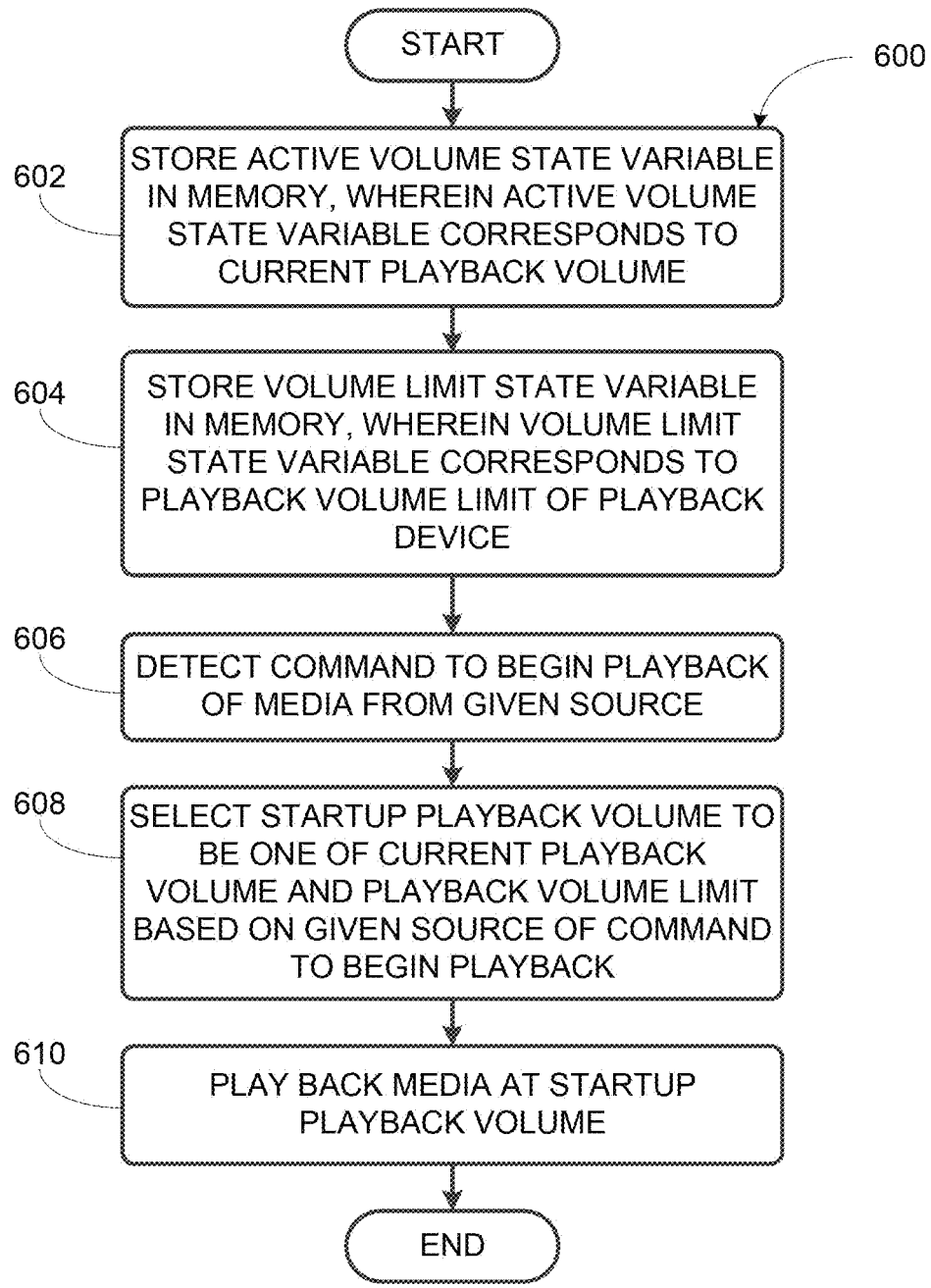
FIG. 6 shows an example flow diagram for determining a volume limit based on a playback command source.

In the examples herein, certain functions are described as being attributed to or carried out by a given device in a media playback system. However, the functions may be carried out by other devices in the system as well. For example, some of the functions in the method 600 shown in FIG. 6 are described with respect to a playback device, but those functions could also be carried out by a control device or a remote device, such as a server. Other examples are also possible.

Figure 5A:
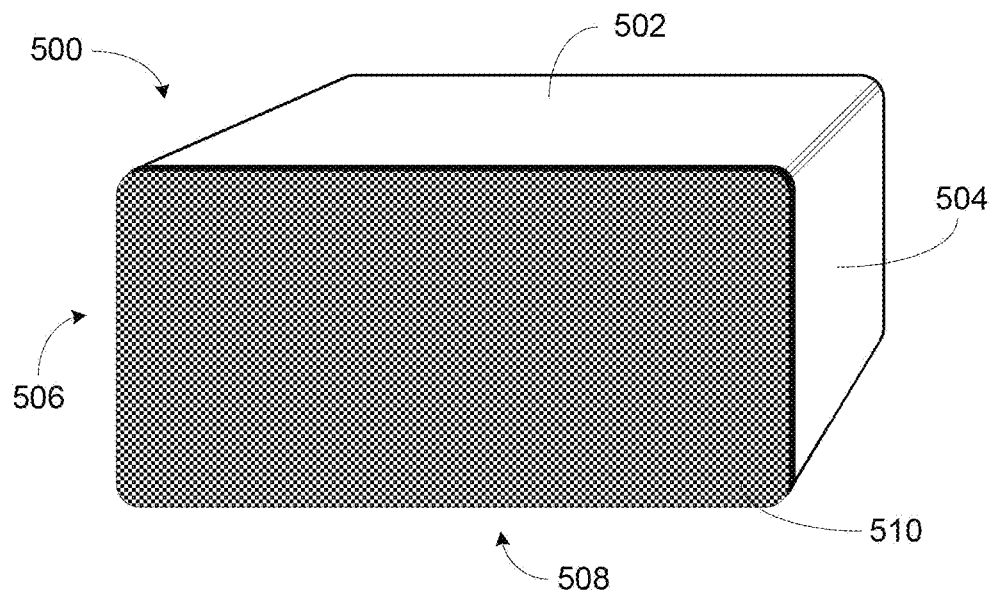
FIG. 5A shows example external surfaces of a playback device.
Figure 5B:
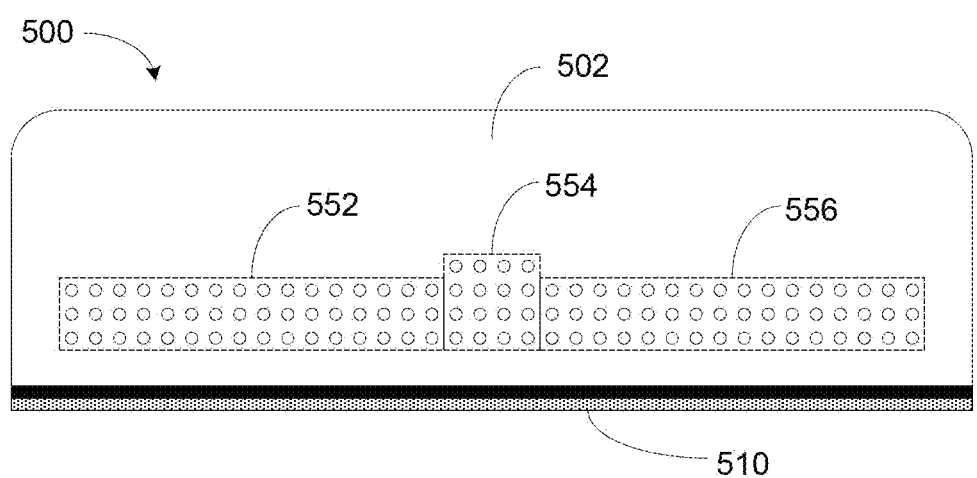
FIG. 5B shows example regions on an external surface of a playback device.
Figure 7:
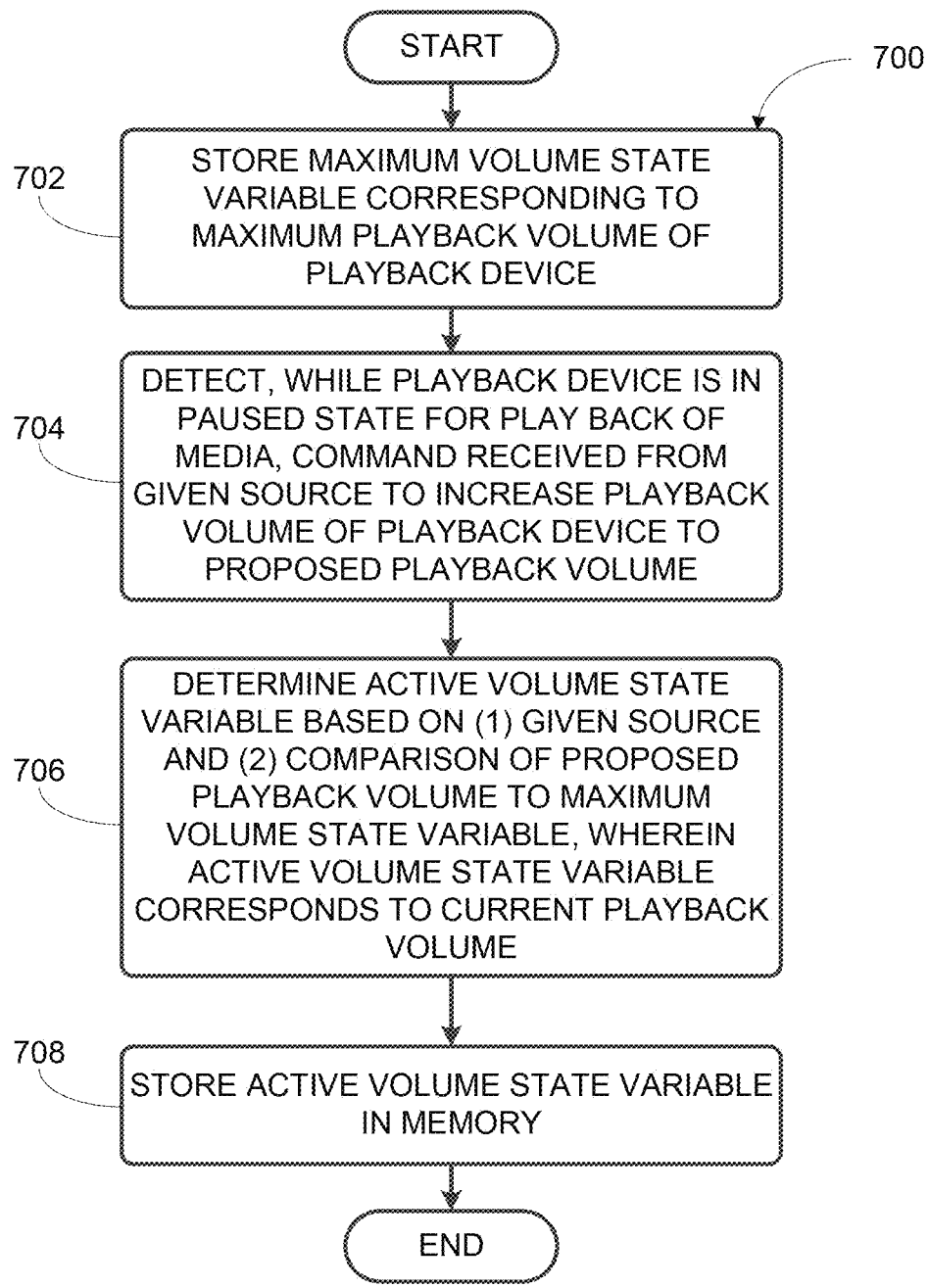
FIG. 7 shows another example flow diagram for determining a volume limit based on a playback command source.

Methods 600 and 700 shown in FIGS. 6 and 7 present embodiments of methods that can be implemented within an operating environment involving, for example, the media playback system 100 of FIG. 1, one or more of the playback device 200 of FIG. 2 or playback device 500 of FIGS. 5A and 5B, and one or more of the control device 300 of FIG. 3. Methods 600 and 700 may include one or more operations, functions, or actions as illustrated by one or more of blocks shown in FIGS. 6 and 7. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

In addition, for the methods 600 and 700 and other processes and methods disclosed herein, the flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the methods 600 and 700 and other processes and methods disclosed herein, each block in FIGS. 6 and 7 may represent circuitry that is wired to perform the specific logical functions in the process.

a. Limiting Playback Volume Based on the Source of the Playback Command

At block 602 of the flow diagram 600, a playback device, such as the playback device 200 of FIG. 2, may store an active volume state variable in memory, such as memory 206. Another example of the playback device may be the playback device 500 shown in FIGS. 5A and 5B, which may include some or all of the features of the playback device 200 shown in FIG. 2, as well as additional features.

FIG. 5A shows the playback device 500 having an external surface configured to detect the one or more physical contacts and that may perform the one or more playback device actions based on locations of the detected one or more physical contacts.

The playback device 500 has a speaker grill 510 and an external surface. The speaker grill 510 may cover a side of the playback device 500 where outward facing speakers of the playback device 500 may be positioned. The external surface may include a first surface 502 and a second surface 504, each of which, as shown, may be substantially perpendicular to the speaker grill 510. The external surface may also include a third surface 506 and a fourth surface 508 that, in FIG. 5A are obscured by the speaker grill 510 and a body of the playback device 500. In some cases, the external surface may further include a back surface of the playback device 500 (not shown), opposite the speaker grill 510.

FIG. 5B shows an alternate view of the playback device 500 from above the playback device 500. In other words, FIG. 5B shows the first surface 502 of the playback device 500. As shown, the first surface 502 may include a first region 552, a second region 554, and a third region 556. Also shown in FIG. 5B is an array of proximity sensors (each represented as a circle) underlying the external surface of the playback device 500. In this case, a first subset of the array of proximity sensors may underlie the first region 552 of the first surface 502, a second subset of the array of proximity sensors may underlie the second region 554 of the first surface 502, and a third subset of the array of proximity sensors may underlie the third region 556 of the first surface 502.

The array of proximity sensors may include one or more types of proximity sensors. For instance, the array of proximity sensors may include one or more capacitive sensors, one or more resistance sensors, one or more Piezo sensors, one or more infrared sensors, one or more inductive sensors, one or more magnetic sensors, and one or more optical sensors, among other possibilities. The array of proximity sensors may be configured to detect physical contact on the first, second, or third regions on the first surface 502. In some cases, the array of proximity sensors may further be configured to detect presence or movement within a proximal distance of the first region 552, second region 554 or third region 556 on the first surface 502. In one case, the one or more types of proximity sensors in the array of proximity sensors may be selected based on a type of material of the first surface 502 and/or a construction of the playback device. Other examples are also possible.

The active volume state variable stored by the playback device 500 may correspond to a current playback volume of the playback device 500. As noted above, the "current" playback volume of the playback device does not necessarily mean that the playback device is playing back media. Rather, it refers to the current volume configuration of the playback device whether it is playing back media or not.

The playback device 500 may be capable of playing back media within a particular volume range, as designed by the manufacturer, for instance. This range may be expressed in decibels, or it may be on a simplified volume scale for ease of use. For example, the playback device 500 may be adjusted to play back media within a volume range of 0-10, or 0-100. Accordingly, a user may adjust the volume of the playback device 500 to a desired level.

For example, the user may adjust the volume level to 76, representing the current playback volume of the playback device 500. The playback device 500 may then store a value of 76 (out of 100) as the active volume state variable in memory 206. In some examples, the active volume state variable may be used by the playback device 500 to maintain the current volume when playback is paused and then resumed, or if the playback device is powered down, for instance. The active volume state variable may also be shared with other playback devices in a media playback system, such as the system 100 shown in FIG. 1, allowing multiple playback devices to play back media in synchrony and at the same volume. Other examples are also possible.

At block 604, the playback device 500 may store a volume limit state variable in memory 206. The volume limit state variable may correspond to a playback volume limit of the playback device, and may be used by the playback device 500 in certain situations. For example, the volume limit state variable may be a maximum volume state variable, corresponding to a maximum playback volume. The volume limit state variable may be, for instance, 50 (out of 100).

A given volume limit state variable may be preset by the manufacturer, or it may be set by a user, among other possibilities. Further, multiple volume limit state variables may be stored by the playback device 500, and each may be based on data that is available the playback device 500. Some examples include time of day, the playback zone within which the playback device 500 is grouped, the current playback state of the playback device 500, or other playback devices in the media playback system 100. In some cases, the playback device 500 may store a volume limit state variable that is to be utilized based on the source of a command to control the playback device 500.

For example, when a command to begin playback of media is received, it may be desirable to utilize a maximum volume state variable. The playback device 500 may have been previously playing back media at a relatively high volume, and thus the stored active volume state variable may be relatively high. If the playback device 500 starts up playback at the relatively high volume, it may be startling to the user. Further, although some control devices may display a representation of the current volume of the playback device 500, such as the volume bar 460 shown in FIG. 4, other control devices might not display such information, and thus it may not be available to the user. Similarly, the playback device 500 might not display this information.

Accordingly, at block 606, the playback device 500 may detect a command to begin playback of media from a given source. The given source may be, for example, a touch sensor located on the playback device 500, such as the proximity sensors underlying the second region 554 shown in FIG. 5B. The source may alternatively be a control device, such as the control device 300 shown in FIG. 3. Other examples are also possible.

At block 608, the playback device may select a startup playback volume to be one of the current playback volume and the playback volume limit, based on the given source of the command to begin playback. For instance, the stored active volume state variable may be 76, corresponding to the current playback volume of the playback device 500. The playback volume limit state variable may be 50, and may correspond to a playback volume limit, in this case a maximum volume of 50. Based on the source of the command to begin playback, the playback device 500 may compare the active volume state variable to the volume limit state variable and determine that the active volume state variable is greater. For instance, the playback device 500 may compare the active volume state variable to the volume limit state variable if it determines that the source of the command is the a touch sensor located on the playback device 500, but it might not compare the state variables if it determines that the source of the command is, for example, a control device, such as the control device 300 shown in FIG. 3. After comparing the state variables, the playback device may then select the startup playback volume to be the maximum playback volume of 50, and then, at block 610, play back media at the startup playback volume. In this way, the playback device 500 may limit the startup playback volume to a more moderate level.

Alternatively, the playback device may determine that the active volume state variable is not greater than the maximum volume state variable. The active volume state variable may be, for example, 40. In this case, the playback device 500 may select the startup playback volume to be the current playback volume of 40, and the playback device 500 will play back media at the current playback volume of 40.

Although a maximum playback volume is discussed in the example above, a volume limit state variable may additionally or alternatively represent a minimum value. For example, based on the source of a playback command, the playback device 500 may use a minimum volume state variable such that playback does not begin at a playback volume less than the minimum volume. As another example, a volume limit state variable may correspond to a specific playback volume that is to be used. For instance, based on the source of a playback command, the playback device 500 may begin playback at the specific volume level regardless of the current playback volume. In this case, the playback device might not compare the active volume state variable to the specific volume limit state variable. Other examples are also possible.

In some examples, the playback device 500 might not utilize the volume limit state variable for every "begin playback" command it receives from a given source. For example, a user might pause playback at the playback device 500 only briefly, and then begin playback again. In this case, it may be desirable to maintain the current playback volume when playback resumes rather than adjust the playback volume by imposing a playback volume limit.

Accordingly, the playback device 500 may detect a command to pause playback of media from the playback device. Based on that command, the playback device 500 may pause the playback of media and further determine a first time corresponding to the command to pause the playback of media. Then, when the playback device detects the command to begin playback of media at block 606, the playback device 500 may determine a second time corresponding to the command to begin playback. The playback device may then determine that the difference between the first time and the second time does not exceed a threshold pause time period. Based on this determination, the playback device 500 might not compare the active volume state variable to the volume limit state variable, and may play back media at the current playback volume.

Alternatively, the playback device may determine that the different between the first time and the second time does exceed the threshold time period. In this case, the playback device may proceed as described above by comparing the active volume state variable to the volume limit state variable. Other examples are also possible.

The threshold pause time period may be, for example, thirty seconds, two minutes, or one hour, among other examples. It may be a default value set by the manufacturer or it may be configurable by the user. In this way, the user may dictate how long playback must remain paused before the volume limits come into effect for beginning playback.

In some cases, a different volume limit state variable may be applied for different command sources. For instance, a command to begin playback detected at the playback device 500 may be associated with a volume limit state variable, as discussed above. The playback device 500 may apply a different volume limit state variable for commands detected from other control devices within the media playback system 100. Further, the playback device 500 may apply a different volume limit state variable depending on the user profile that is registered to the particular control device that receives the command. Other examples are also possible.

Additionally, the identity of a playback command source might not be the only criteria on which a volume limit state variable is based. As noted above, the playback device 500 might be a part of a media playback system, such as the media playback system 100. A volume limit state variable may be applied to all playback devices in a given zone. For example, all playback devices in the bedroom zone may include the same volume limit state variable, regardless of the playback command source. A volume limit state variable may additionally or alternatively be applied based on any commands received from control devices in a zone other than the playback device's current zone. For example, if a playback device in the living room zone detects a command to begin playback from a control device located in a different zone, a volume limit state variable may be applied. Thus, the location of the command source may also be considered.

In addition, the playback device 500 may adjust volume limit state variables based on context. For instance, the playback device 500 may be located in a first zone of the media playback system 100, such as the dining room zone. The playback device 500 may correspond to, for instance, the playback device 112. The given source of a command to begin playback may be, for instance, a control device 300 this is located within the dining room zone. In this case, the playback device 500 may have stored in memory a particular volume limit state variable that corresponds to playback commands detected from the control device 300 within the same zone.

However, the playback device 500 may determine that the control device 300 is in a second playback zone, such as the master bedroom zone, when the command to begin playback is detected. The playback device 500 may then, based on the determination that the control device 300 is within the second playback zone, adjust the volume limit state variable. For example, the volume limit state variable associated with the control device 300 may be a maximum volume limit that is reduced when the command is detected from a second playback zone. Other examples are also possible.

b. Limiting a Volume Control Command Based on the Source of the Command

Other types of playback commands, in addition to commands to begin playback of media, may involve the use of volume limit state variables. For instance, a command to increase or decrease the playback volume of a playback device may be limited in some situations.

For example, at block 702 of the flow diagram 700, a playback device, such as the playback device 200 of FIG. 2, may store a maximum volume state variable. Another example of the playback device may be the playback device 500 shown in FIGS. 5A and 5B, which may include some or all of the features of the playback device 200 shown in FIG. 2, as well as additional features. The maximum volume state variable may be stored in memory, such as memory 206, and may further correspond to a maximum playback volume of the playback device 500, as discussed above. For instance, the maximum volume state variable maybe 50 (out of 100).

A user may pause the playback of media from the playback device 500. While the playback device 500 is in a paused state, it may be possible to adjust the playback volume of the playback device 500. However, without the playing media to use as a reference, it may be desirable to limit extent to which the playback volume can be adjusted while playback is paused. This may avoid intentionally or accidentally resuming playback to a volume that is startlingly loud. Further, as noted above, some control devices, including the playback device 500, might not include a display that indicates the current playback volume.

At block 704, the playback device 500 may detect, while the playback device is in a paused state for play back of media, a command to increase the playback volume of the playback device to a proposed playback volume. The detected command may be received from a given source. For example, the detected command may be received from a touch sensor located on the playback device 500, such as the proximity sensors underlying the third region 556 shown in FIG. 5B.

At block 706, the playback device 500 may determine an active volume state variable. The active volume state variable may correspond to the current playback volume of the playback device 500. Further, the active volume state variable may be determined based on the given source, as well as a comparison of the proposed playback volume to the maximum volume state variable. For example, the playback device 500 may determine that the proposed playback volume is greater than the maximum volume state variable. In this case, the determined active volume state variable corresponding to the current playback volume is the maximum playback volume.

For example, the while the playback device 500 is in a paused state, the playback device may detect a command to increase the playback volume to a proposed playback volume of 90 (out of 100). The playback device may determine that this is greater than the maximum volume state variable, and therefore determine the active volume state variable to be 50. The current playback volume is therefore the maximum playback volume, and when playback of media resumes, the playback volume will be 50.

Alternatively, the playback device 500 may determine that the proposed playback volume is not greater than the maximum volume state variable. For example, the playback device may detect a command to increase the playback volume to 46. In this case, the determined active volume state variable corresponding to the current playback volume is the proposed playback volume of 46.

At block 708, the playback device 500 may store the active volume state variable in memory, such as memory 206. The playback device 500 may then detect a command to begin playback of media. Based on that command, play back media at the current playback volume, as determined by the active volume state variable.

Although the example above has been described with reference to a maximum volume state variable, a minimum volume state variable is also possible. For example, it may be desirable to determine a minimum playback volume to which the playback device 500 may be set while in a paused state.

In some embodiments, the playback device 500 may be configured to ignore or disregard touch input that have a high probability of being accidental. For example, as shown in FIG. 5B, there are multiple regions for receiving touch commands on the playback device 500, such as the first region 552, second region 554 and third region 556. Other configurations are also possible. When a touch input is detected at two or more of these regions simultaneously, it may indicate that the touch is accidental. For instance, it may indicate that a user inadvertently rested a hand on the top of the playback device 500, that a small child is touching the top of the playback device 500, or perhaps that a pet is contacting the top of the playback device 500. Accordingly, when a touch is detected at two or more regions simultaneously, the playback device may determine that there has been no input.

Similarly, the playback device 500 may continue to disregard touch inputs via the regions 552, 554, and 556 of the playback device 500 until all of the multiple touches have been removed from the playback device 500, and the device detects no touch inputs. For example, if a touch is simultaneously detected at both region 552 and 556, both with be ignored as inputs. If the touch at 552 is no longer detected, but the touch as 556 is still detected, the playback device will continue to disregard all inputs from the input regions until the touch as region 556 is no longer detected. In this way, the playback device 500 may increase the probability that touches to the input regions are intentional touches by a user.

c. State Indicative LED Lighting

In some embodiments, a playback device such as the playback device 500 may include LED lighting on one or more surfaces of the playback device 500 that may provide feedback on the status of the playback device 500. The LED lighting may include several different colors of LED lights, such as red, blue, green, and white, which may be mixed to create a broad spectrum of colors. The playback device 500 may also be capable of fading the LED lighting between different colors smoothly and without noticeable flickering.

For example, a playback device 500 may have stored in memory one or more LED behavior patterns, each corresponding to a state of the playback device 500. Some LED behaviors may be a sequence of flashes, featuring one or more colors, to indicate a given state. Other states of the playback device 500 may be indicated by a constant LED light of a given color.

FIG. 8 shown an example schedule of LED behaviors corresponding to different states of the playback device 500. The color abbreviations are W for white, G for green, and A for Amber. A "quick breathe fade" of an LED may correspond to a 0.6 second fade in, 0.2 second hold-on, 0.6 second fade out, and a 0.6 second hold-off. Alternatively, a "Sonos join fade" of an LED may correspond to a 0.6 second fade in, 2.2 second hold-on, 0.6 second fade out, and a 0.6 second hold-off. All fades may be cubic and vary based on the initial brightness of the LED.

By way of example, when the playback device 500 is powered but is not connected to the household ID, a series of four green LED Sonos join fades will repeat until the state ends. As another example, when the playback device 500 detects a finger touching any capacitive area, the LED will remain constantly white for the duration of the touch contact. Numerous other states are possible for the playback device 500, as well as other LED sequences and colors.

In some embodiments, the playback device 500 may be in communication with a second playback device, such as the playback device shown in FIG. 2. For instance, the playback device 500 and 200 may be grouped together in a zone in the media playback system 100. The playback device 200 may include LED lighting, but it might not have stored in memory the same LED behavior patterns that are stored in the memory of playback device 500. In this case, the playback device 200 may inherit the LED behavior patterns of the playback device 500. For instance, the playback device 200 may store in its memory the LED behavior patterns of the playback device 500. This inheritance of LED behavior patterns may be automatic, or it may be based on the playback device 500 being the zone controller between the two playback devices. Additionally or alternatively, the inheritance of LED behaviors between two playback devices may be user controlled.

IV. CONCLUSION

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only way(s) to implement such systems, methods, apparatus, and/or articles of manufacture.

As indicated above, the examples involve limiting the playback volume of a playback device based on the source of a command to control the playback device. As indicated above, the examples involve limiting the playback volume of a playback device based on a source of the playback command. In one aspect, a playback device is provided. The playback device includes (a) a processor, (b) a non-transitory computer-readable medium, and (c) program instructions stored on the non-transitory computer-readable medium that, when executed by the processor, cause the playback device to perform functions including (i) storing an active volume state variable in memory, where the active volume state variable corresponds to a current playback volume, (ii) storing a volume limit state variable in memory, where the volume limit state variable corresponds to a playback volume limit of the playback device, (iii) detecting, by the playback device, a command to begin playback of media from a given source, (iv) selecting a startup playback volume to be one of the current playback volume and the playback volume limit based on the given source of the command to begin playback, and (v) playing back media at the startup playback volume.

In another aspect, a playback device is provided. The playback device includes (a) a processor, (b) a non-transitory computer-readable medium, and (c) program instructions stored on the non-transitory computer-readable medium that, when executed by the processor, cause the playback device to perform functions including (i) storing, by the playback device, a maximum volume state variable corresponding to a maximum playback volume of the playback device, (ii) detecting, while the playback device is in a paused state for play back of media, a command received from a given source to increase the playback volume of the playback device to a proposed playback volume, (iii) determining an active volume state variable based on (1) the given source and (2) a comparison of the proposed playback volume to the maximum volume state variable, where the active volume state variable corresponds to a current playback volume, and (iv) storing the active volume state variable in memory.

In yet another aspect, a method is provided. The method involves (a) storing, by a playback device, an active volume state variable in memory, where the active volume state variable corresponds to a current playback volume, (b) storing a volume limit state variable in memory, where the volume limit state variable corresponds to a playback volume limit of the playback device, (c) detecting, by the playback device, a command to begin playback of media from a given source, (d) selecting a startup playback volume to be one of the current playback volume and the playback volume limit based on the given source of the command to begin playback, and (e) playing back media at the startup playback volume.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

The invention claimed is:

1. A playback device, the playback device comprising:
at least one processor;
at least one non-transitory computer-readable medium; and
program instructions stored on the at least one non-transitory computer-readable medium that are executable by the at least one processor such that the playback device is configured to:
store an active volume state variable in memory, wherein the active volume state variable corresponds to a current playback volume;
store a volume limit state variable in memory, wherein the volume limit state variable corresponds to a playback volume limit of the playback device;
while the playback device is not playing back media:
receive, from a control device, a command to begin playback of media;
based on the command, determine a location of the control device relative to the playback device; and
based on determining the location of the control device relative to the playback device, select a startup playback volume to be one of the current playback volume or the playback volume limit; and begin playback of media at the startup playback volume.

2. The playback device of claim 1, wherein the volume limit state variable is a maximum volume state variable and the playback volume limit is a maximum playback volume, and wherein the playback device further comprises program instructions that are executable by the at least one processor such that the playback device is configured to:

determine that the active volume state variable is greater than the maximum volume state variable, wherein the selected startup playback volume is the maximum playback volume.

3. The playback device of claim 2, wherein the playback device further comprises program instructions that are executable by the at least one processor such that the playback device is configured to:

update the active volume state variable to correspond to the playback volume limit of the playback device.

4. The playback device of claim 1, wherein the volume limit state variable is a maximum volume state variable and the playback volume limit is a maximum playback volume, and wherein the playback device further comprises program instructions that are executable by the at least one processor such that the playback device is configured to:

determine that the active volume state variable is not greater than the maximum volume state variable, wherein the selected startup playback volume is the current playback volume.

5. The playback device of claim 1, wherein the playback device is located in a zone of a media playback system, and wherein the program instructions that are executable by the at least one processor such that the playback device is configured to determine the location of the control device relative to the playback device comprise program instructions that are executable by the at least one processor such that the playback device is configured to determine that the control device is in the zone of the media playback system.

6. The playback device of claim 1, wherein the playback device is located in a first zone of a media playback system, and wherein the program instructions that are executable by the at least one processor such that the playback device is configured to determine the location of the control device relative to the playback device comprise program instructions that are executable by the at least one processor such that the playback device is configured to determine that the control device is in a second zone of the media playback system.

7. The playback device of claim 1, wherein the playback device comprises the control device.

8. The playback device of claim 1, wherein the playback device is a first playback device of a media playback system, and wherein the control device is a second playback device of the media playback system.

9. The playback device of claim 1, wherein the command to begin playback of media is a command to resume playback of previously paused media.

10. A non-transitory computer-readable medium, wherein the non-transitory computer-readable medium is provisioned with program instructions that, when executed by at least one processor, cause a playback device to:

store an active volume state variable in memory, wherein the active volume state variable corresponds to a current playback volume;

store a volume limit state variable in memory, wherein the volume limit state variable corresponds to a playback volume limit of the playback device;

while the playback device is not playing back media:

receive, from a control device, a command to begin playback of media;

based on the command, determine a location of the control device relative to the playback device; and based on determining the location of the control device relative to the playback device, select a startup playback volume to be one of the current playback volume or the playback volume limit; and begin playback of media at the startup playback volume.

11. The non-transitory computer-readable medium of claim 10, wherein the volume limit state variable is a maximum volume state variable and the playback volume limit is a maximum playback volume, and wherein the non-transitory computer-readable medium is also provisioned with program instructions that, when executed by at least one processor, cause the playback device to:

determine that the active volume state variable is greater than the maximum volume state variable, wherein the selected startup playback volume is the maximum playback volume.

12. The non-transitory computer-readable medium of claim 11, wherein the non-transitory computer-readable medium is also provisioned with program instructions that, when executed by at least one processor, cause the playback device to:

update the active volume state variable to correspond to the playback volume limit of the playback device.

13. The non-transitory computer-readable medium of claim 10, wherein the volume limit state variable is a maximum volume state variable and the playback volume limit is a maximum playback volume, and wherein the non-transitory computer-readable medium is also provisioned with program instructions that, when executed by at least one processor, cause the playback device to:

determine that the active volume state variable is not greater than the maximum volume state variable, wherein the selected startup playback volume is the current playback volume.

14. The non-transitory computer-readable medium of claim 10, wherein the playback device is located in a zone of a media playback system, and wherein the program instructions that, when executed by at least one processor, cause the playback device to determine the location of the control device relative to the playback device comprise program instructions that, when executed by at least one processor, cause the playback device to determine that the control device is in the zone of the media playback system.

15. The non-transitory computer-readable medium of claim 10, wherein the playback device is located in a first zone of a media playback system, and wherein the program instructions that, when executed by at least one processor, cause the playback device to determine the location of the control device relative to the playback device comprise program instructions that, when executed by at least one processor, cause the playback device to determine that the control device is in a second zone of the media playback system.

16. The non-transitory computer-readable medium of claim 10, wherein the playback device comprises the control device.

17. The non-transitory computer-readable medium of claim 10, wherein the playback device is a first playback device of a media playback system, and wherein the control device is a second playback device of the media playback system.

18. The non-transitory computer-readable medium of claim 10, wherein the command to begin playback of media is a command to resume playback of previously paused media.

19. A method implemented by a playback device, the method comprising:
 storing an active volume state variable in memory, wherein the active volume state variable corresponds to a current playback volume;
 storing a volume limit state variable in memory, wherein the volume limit state variable corresponds to a playback volume limit of the playback device;
 while the playback device is not playing back media:
  receiving, from a control device, a command to begin playback of media;
  based on the command, determining a location of the control device relative to the playback device; and
  based on determining the location of the control device relative to the playback device, selecting a startup playback volume to be one of the current playback volume or the playback volume limit; and
 beginning playback of media at the startup playback volume.

20. The method of claim 19, wherein the volume limit state variable is a maximum volume state variable and the playback volume limit is a maximum playback volume, the method further comprising:
 determining that the active volume state variable is greater than the maximum volume state variable, wherein the selected startup playback volume is the maximum playback volume.

\* \* \* \* \*